(12) United States Patent
Kim

(10) Patent No.: US 7,436,226 B2
(45) Date of Patent: Oct. 14, 2008

(54) POWER-UP DETECTION CIRCUIT THAT OPERATES STABLY REGARDLESS OF VARIATIONS IN PROCESS, VOLTAGE, AND TEMPERATURE, AND SEMICONDUCTOR DEVICE THEREOF

(75) Inventor: Dong Kyun Kim, Cheongju-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 118 days.

(21) Appl. No.: 11/153,312

(22) Filed: Jun. 16, 2005

(65) Prior Publication Data

US 2006/0145739 A1 Jul. 6, 2006

(30) Foreign Application Priority Data

Dec. 30, 2004 (KR) ............... 10-2004-0117052

(51) Int. Cl.
*H03L 7/00* (2006.01)
(52) U.S. Cl. .................... 327/143; 327/142
(58) Field of Classification Search .......... None
See application file for complete search history.

(56) References Cited

U.S. PATENT DOCUMENTS

| 5,345,422 | A |   | 9/1994 | Redwine |         |
|-----------|---|---|--------|---------|---------|
| 5,347,173 | A |   | 9/1994 | McAdams |         |
| 5,513,358 | A | * | 4/1996 | Lundberg et al. | 327/143 |
| 6,104,221 | A |   | 8/2000 | Hoon |         |
| 6,204,701 | B1 | * | 3/2001 | Tsay et al. | 327/143 |
| 6,320,809 | B1 |   | 11/2001 | Raad |         |
| 6,593,790 | B2 | * | 7/2003 | Kim | 327/198 |
| 6,873,192 | B2 |   | 3/2005 | Kang et al. |         |
| 6,885,605 | B2 | * | 4/2005 | Lee et al. | 365/226 |
| 7,161,396 | B1 | * | 1/2007 | Zhou et al. | 327/143 |
| 2003/0117875 | A1 |   | 6/2003 | Lee et al. |         |
| 2004/0124894 | A1 |   | 7/2004 | Kang et al. |         |
| 2004/0189357 | A1 |   | 9/2004 | Kang et al. |         |
| 2005/0035796 | A1 | * | 2/2005 | Chun et al. | 327/143 |

FOREIGN PATENT DOCUMENTS

| JP | 04-139914 | 5/1992 |
| JP | 8124383 | 5/1996 |
| KR | 1020010061375 | 7/2001 |
| KR | 1020030058272 | 7/2003 |
| KR | 1020050041595 | 5/2005 |

* cited by examiner

*Primary Examiner*—Cassandra Cox
(74) *Attorney, Agent, or Firm*—Lowe Hauptman Ham & Berner, LLP

(57) ABSTRACT

A power-up detection circuit which operates in a stable way regardless of variation in PVT. The power-up detection circuit includes a bias circuit that generates a bias voltage in response to an external voltage, and a detection circuit that generates a detection signal in response to the bias voltage. The response speed of the bias circuit to the external voltage and the response speed of the detection circuit to the bias voltage vary depending upon process, voltage and temperature (PVT). Accordingly, the power-up detection circuit and semiconductor device including the same can operate in a stable manner regardless of variation in PVT.

18 Claims, 3 Drawing Sheets

POWER-UP DETECTION CIRCUIT THAT OPERATES STABLY REGARDLESS OF VARIATIONS IN PROCESS, VOLTAGE, AND TEMPERATURE, AND SEMICONDUCTOR DEVICE THEREOF

BACKGROUND

1. Field of the Invention

The present invention relates to a semiconductor device. More specifically, the present invention relates to a power-up detection circuit for use in a semiconductor device.

2. Discussion of Related Art

Generally, in order to guarantee stable operation of a semiconductor device, the semiconductor device has to operate within a predetermined operational power range. To this end, the semiconductor device includes a power-up detection circuit for detecting the level of a power supply voltage when power is supplied. The power-up detection circuit generates a control signal to initialize internal circuits of the semiconductor device when the power supply voltage serves as an operational voltage, and generates a control signal, which controls the internal circuits of the semiconductor device to enter a power-off mode, when the power supply voltage exceeds the operational voltage.

FIG. 1 is a circuit diagram of a conventional power-up detection circuit. Referring to FIG. 1, the power-up detection circuit 10 includes resistors R1, R2, a PMOS transistor P1, a NMOS transistor N1, and an inverter 11. The operation of the power-up detection circuit 10 is described below.

A voltage VDD is divided by the resistors R1, R2. A signal D1, having a voltage level divided in a node A1, is thus output. The NMOS transistor N1 is turned on or off according to the voltage level of a signal D1. A voltage level of a signal D2 generated from a node A2 is also changed depending upon the operation of the NMOS transistor N1. For example, when the voltage VDD increases, the voltage level of the signal D1 increases in proportion to the voltage VDD. If the voltage VDD becomes a voltage level to which the voltage level of the signal D1 is set, the NMOS transistor N1 is turned on. As a result, the voltage level of the signal D2 abruptly decreases. The inverter 11 senses such an abrupt decrease in the voltage level, and thus enables a detection signal PWRUP.

Since the current driving ability of the PMOS transistor P1 and the NMOS transistor N1 can be changed according to process, voltage and temperature (hereinafter, referred to as "PVT"), however, the power-up detection circuit 10 may operate erroneously. In other words, even when the voltage VDD exceeds a stable operational voltage, the power-up detection circuit 10 can detect that the voltage VDD is a stable operational voltage. Additionally, even when the voltage VDD falls within a stable operational voltage, the power-up detection circuit 10 can detect that the voltage VDD exceeds a stable operational voltage.

The operation of the power-up detection circuit 10 depending upon variation in PVT will be described in more detail with reference to FIG. 2. The voltage level of the signal D1 has nothing to do with variation in PVT. This is because resistance values of the resistors R1, R2 are likely to vary in proportion to variation in PVT. That is, if a resistance value of the resistor R1 increases, a resistance value of the resistor R2 increases in proportion to the resistance value of the resistor R1. Therefore, the voltage level of the signal D1 generated from the node D1 increases proportionally when the voltage VDD increases regardless of variation in PVT, as shown in FIG. 2.

The voltage level of the signal D2 generated from the node A2, however, varies in various manners depending upon variation in PVT. In other words, the speeds of the NMOS transistor N1 and the PMOS transistor P1, which respond to voltages input to their gates, vary depending upon variation in PVT. In FIG. 2, "TT" indicates a waveform of the signal D2 when the response speeds of the NMOS transistor N1 and the PMOS transistor P1 are typical and a temperature thereof is 25° C. "FF" indicates a waveform of the signal D2 when the response speeds of the NMOS transistor N1 and the PMOS transistor P1 are the fastest and a temperature thereof is 125° C. Further, "SS" indicates a waveform of the signal D2 when the response speeds of the NMOS transistor N1 and the PMOS transistor P1 are the slowest and a temperature thereof is −10° C. "SF" indicates a waveform of the signal D2 when the response speed of the NMOS transistor N1 is the slowest and the response speed of the PMOS transistor P1 is the fastest, and a temperature thereof is 125° C. Moreover, "FS" indicates a waveform of the signal D2 when the response speed of the NMOS transistor N1 is the fastest and the response speed of the PMOS transistor P1 is the slowest, and a temperature thereof is −10° C.

As shown in FIG. 2, if the voltage VDD increases, the voltage level of the signal D1 also increases proportionally. The voltage level of the signal D2 increases in proportion to the voltage VDD until the NMOS transistor N1 is turned on, but abruptly transitions to a low level at a time where the NMOS transistor N1 is turned on. It can be seen that, among the waveforms "FF", "SS", "TT", "SF" and "FS", the waveform "FS" shifts to a low level fastest, and the waveform "SF" transits to a low level slowest. Furthermore, a time where the NMOS transistor N1 is turned on in the waveform "FS" is when the voltage VDD becomes a voltage Vd1, and a time where the NMOS transistor N1 is turned on in the waveform "SF" is when the voltage VDD becomes a voltage Vd2. As a result, a target voltage value that must be detected by the power-up detection circuit 10 can vary from Vd1 to Vd2 depending upon variation in PVT. Moreover, since the target voltage value of the power-up detection circuit 10 varies greatly, there is an increasing possibility that the power-up detection circuit 10 may operate erroneously. This problem is even more likely in the case of a low power semiconductor device having a low operating voltage. For example, in a semiconductor device having an operating voltage of 1.5V, if a target detecting value of the power-up detection circuit 10 is changed to 2V due to variation in PVT, the power-up detection circuit 10 controls the semiconductor device to enter a power-off mode if the voltage VDD becomes lower than 2V.

As such, the semiconductor device cannot operate in a stable way due to such malfunction of the power-up detection circuit 10. As described above, in the conventional power-up detection circuit, a target detecting voltage can vary due to variation in PVT. Accordingly, there is a problem in that stable operation of a semiconductor device cannot be guaranteed.

SUMMARY OF THE INVENTION

Accordingly, the present invention has been made in view of the above problems, and it is an object of the present invention to provide a power-up detection circuit that operates in a stable manner regardless of variation in PVT in such a manner that a bias voltage level of a pull-down circuit that outputs a detection signal is changed so that detection error depending upon variation in PVT can be compensated for.

Another object of the present invention is to provide a semiconductor device having a power-up detection circuit that operates in a stable manner regardless of variation in PVT in such a manner that a bias voltage level of a pull-down circuit that outputs a detection signal is changed so that detection error depending upon variation in PVT can be compensated for.

To achieve the above objects, according to an aspect of the present invention, there is provided a power-up detection circuit, including a bias circuit that generates a bias voltage in response to an external voltage, and a detection circuit that generates a detection signal in response to the bias voltage, wherein the response speed of the bias circuit to the external voltage and the response speed of the detection circuit to the bias voltage vary depending upon process, voltage and temperature (PVT).

According to another aspect of the present invention, there is provided a semiconductor device, including a power-up detection circuit for monitoring variation in an external voltage, determining whether the external voltage falls within a range of a target detection voltage, and generating a detection signal according to the determination result, a control circuit that generates a mode control signal in response to the detection signal, and an internal circuit that switches to an operating mode for operation or to a power-off mode for stop, in response to the mode control signal, wherein the target detection voltage of the power-up detection circuit is changed in such a way to compensate for detection error depending upon variation in PVT.

DETAILED DESCRIPTION OF PREFERRED EMBODIMENTS

Embodiments of the present invention will be described with reference to the accompanying drawings. Since embodiments are provided so that an ordinary person skilled in the art are able to understand the present invention, they may be modified in various manners and the scope of the present invention is not limited by the embodiments described herein.

Figure 1:
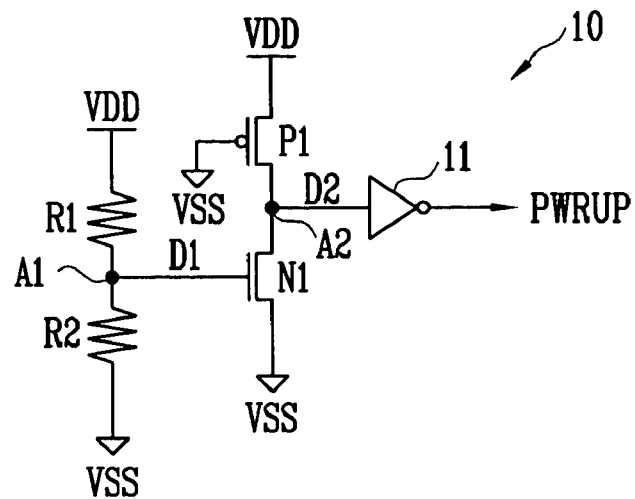
FIG. 1 is a circuit diagram of a conventional power-up detection circuit.
Figure 2:
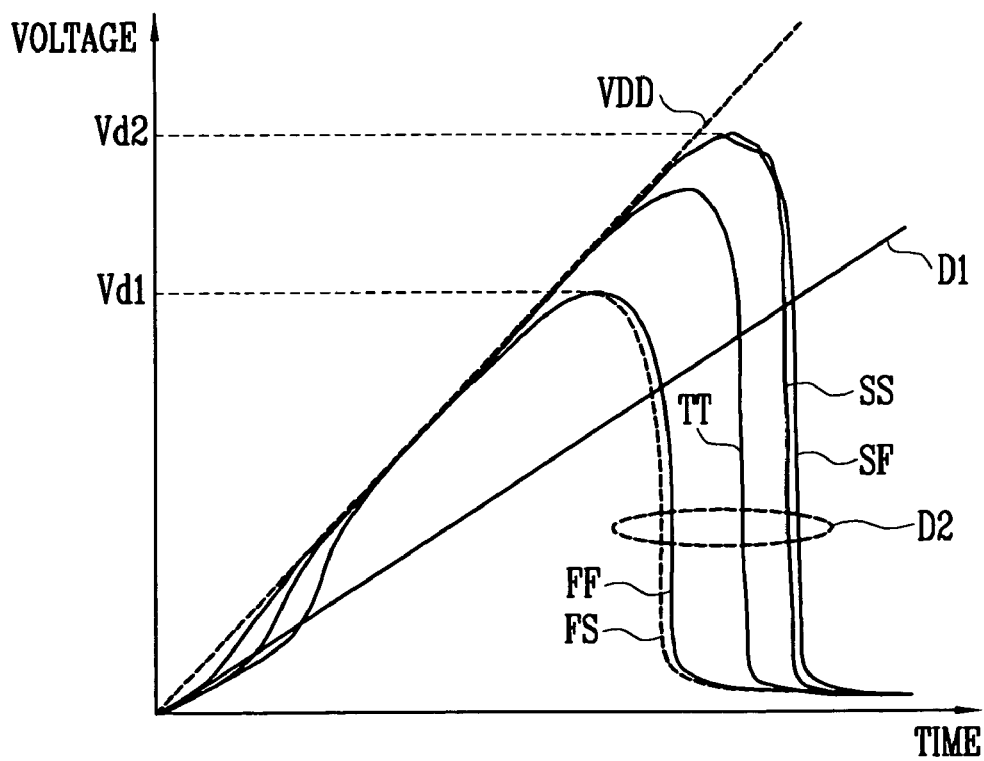
FIG. 2 is a waveform showing signals related to the power-up detection circuit shown in FIG. 1.
Figure 3:
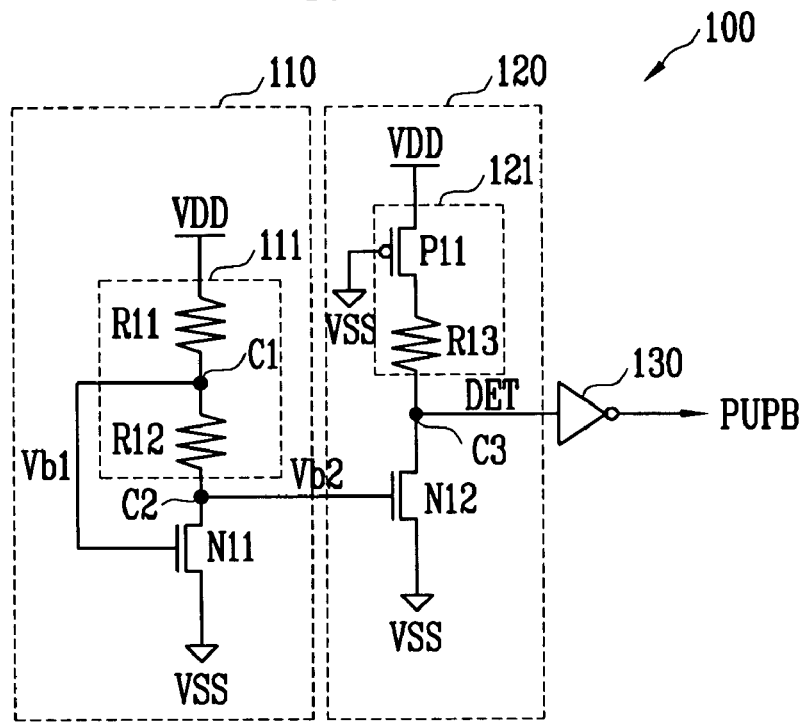
FIG. 3 is a circuit diagram of a power-up detection circuit according to an embodiment of the present invention.

FIG. 3 is a circuit diagram of a power-up detection circuit according to an embodiment of the present invention.

Referring to FIG. 3, the power-up detection circuit 100 includes a bias circuit 110, a detection circuit 120, and an inverter 130. The bias circuit 110 includes a voltage divider 111 and an output circuit N11. The voltage divider 111 includes resistors R11, R12. The resistor R11 is connected between an external voltage VDD and a node C1, and the resistor R12 is connected between the node C1 and a node C2 in a serial manner to the resistor R11. The external voltage VDD is divided according to the resistance ratios of the resistors R11, R12, and a divided voltage Vb1 is generated from the node C1. The output circuit N11 can be implemented using a NMOS transistor. The output circuit N11 will be hereinafter referred to as a NMOS transistor. The NMOS transistor N11 has a gate connected to the node C1, a drain connected to the node C2, and a source connected to a ground voltage VSS. The NMOS transistor N11 is turned on or off according to the divided voltage Vb1, and a bias voltage Vb2 is generated from the node C2 by means of the NMOS transistor N11. In more detail, when the NMOS transistor N11 is turned on, the bias voltage Vb2 decreases, and when the NMOS transistor N11 is turned off, the bias voltage Vb2 increases.

The detection circuit 120 includes a pull-up circuit 121 and a pull-down circuit N12. The pull-up circuit 121 includes a PMOS transistor P11 and a resistor R13. The pull-down circuit N12 can be implemented using a NMOS transistor. The pull-down circuit N12 will be hereinafter referred to as a NMOS transistor. The PMOS transistor P11 has a source connected to an external voltage VDD, a gate connected to a ground voltage VSS, and a drain connected to the resistor R13. The resistor R13 is connected to a node C3. The PMOS transistor P11 is turned on according to the ground voltage VSS, and the external voltage VDD is supplied to the NMOS transistor N11 through the resistor R13. The NMOS transistor N12 has a drain connected to the node C3, a gate to which the bias voltage Vb2 generated from the node C2 is input, and a source to which the ground voltage VSS is input. The NMOS transistor N12 is turned on or off according to the bias voltage Vb2. The node C3 generates a detection signal DET according to the operation of the detection circuit 120. The inverter 130 serves as an output driver that inverts the detection signal DET and outputs the inverted signal as a detection signal PUPB. Alternately, an inverter (not shown) can be further added to the output terminal of the inverter 130, when needed, and the detection signal PUPB can be inverted by the additional inverter.

The operation of the power-up detection circuit 100 will now be described in more detail with reference to FIG. 4. The operation depending upon variation in PVT will be first described in detail.

If the external voltage VDD gradually increases from 0V, the divided voltage Vb1 also increases. At this time, the bias voltage Vb2 increases until the divided voltage Vb1 fulfills the turn-on condition of the NMOS transistor N11. Thereafter, when the divided voltage Vb1 sufficiently increases to fulfill the turn-on condition of the NMOS transistor N11, the NMOS transistor N11 is turned on. The bias voltage Vb2 increases in proportion to the external voltage VDD until the NMOS transistor N11 is turned on. If the NMOS transistor N11 is turned on, the bias voltage Vb2 gradually decreases. At this time, the bias voltage Vb2 varies depending upon variation in PVT. That is, the response speed of the NMOS transistor N11 to the divided voltage Vb1 varies according to variation in PVT. The resistance values of the resistors R11, R12 are changed depending upon variation in temperature among variation in PVT. More particularly, if a temperature rises, the resistance values of the resistors R11, R12 also increase. If a temperature drops, the resistance values of the resistors R11, R12 also decrease.

Figure 4:
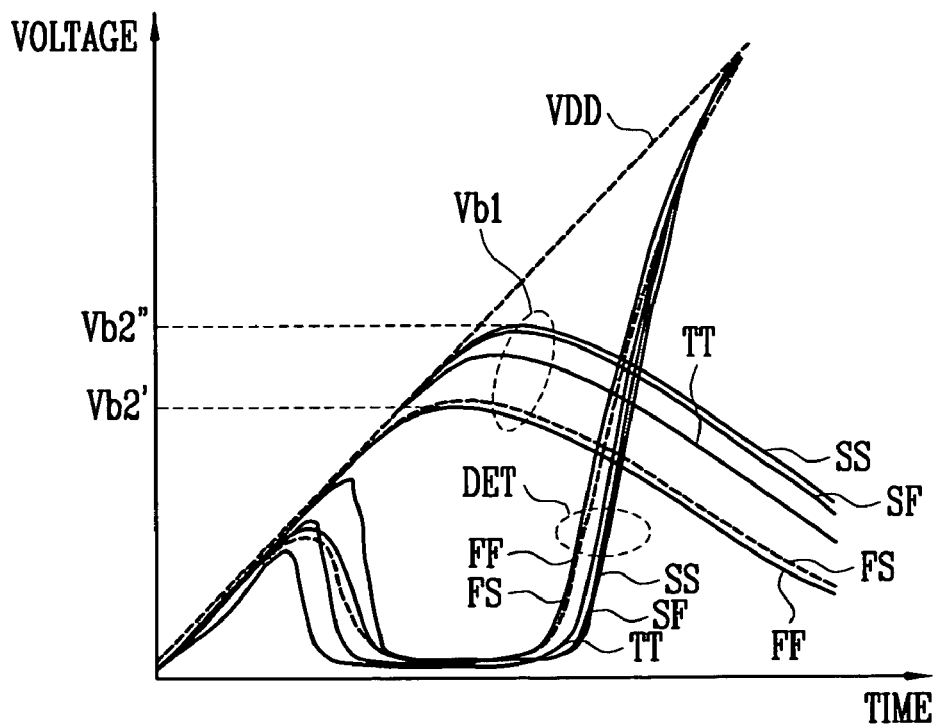
FIG. 4 is a waveform showing signals related to the power-up detection circuit shown in FIG. 3.

In FIG. 4, "TT" indicates a waveform of the bias voltage Vb2 when the response speed of the NMOS transistor N11 is typical, and a temperature thereof is 25° C. "FF" indicates a waveform of the bias voltage Vb2 when the response speed of the NMOS transistor N11 is the fastest, and a temperature thereof is 125° C. "SS" indicates a waveform of the bias voltage Vb2 when the response speed of the NMOS transistor N11 is the slowest, and a temperature thereof is −10° C. "SF" indicates a waveform of the bias voltage Vb2 when the response speed of the NMOS transistor N11 is the slowest, and a temperature thereof is 125° C. "FS" indicates a waveform of the bias voltage Vb2 when the response speed of the NMOS transistor N11 is the fastest, and a temperature thereof is −10° C.

As can be seen from FIG. 4, when the voltage VDD increases, the bias voltage Vb2 rises until the NMOS transistor N11 is turned on. Thereafter, if the NMOS transistor N11 is turned on, the bias voltage Vb2 decreases. At this time, as a result of comparing the condition of the NMOS transistor N11, which corresponds to the waveform "SS" in which the highest value of the bias voltage Vb2 is the largest, and the condition of the NMOS transistor N11, which corresponds to "FF" in which the highest value of the bias voltage Vb2 is the smallest, it can be expressed into the following table 1.

| Waveform | Threshold Voltage of N11 | Channel Length of N11 | Channel Width of N11 | Thickness of Gate Insulating Layer of N11 |
| --- | --- | --- | --- | --- |
| SS | Vth1 (Highest value) | L1 (Highest value) | W1 (Lowest value) | Tox1 (Lowest value) |
| FF | Vth2 (Lowest value) | L2 (Lowest value) | W2 (Highest value) | Tox2 (Highest value) |
| Compare | Vth1 > Vth2 | L1 > L2 | W1 < W2 | Tox1 < Tox2 |

As can be seen from the above table, the condition in which the response speed of the NMOS transistor N11 is the fastest corresponds to the waveform "FF", and the condition in which the response speed of the NMOS transistor N11 is the slowest corresponds to the waveform "SS". Furthermore, when the response speed of the NMOS transistor N11 is the fastest, the voltage level of the divided voltage Vb11 to which the NMOS transistor N11 responds decreases. When the response speed of the NMOS transistor N11 is the slowest, the voltage level of the divided voltage Vb1 to which the NMOS transistor N11 responds increases. For example, the NMOS transistor N11 having the fastest response speed is turned on when the divided voltage Vb1 becomes 0.58V, and the NMOS transistor N11 having the slowest response speed is turned on when the divided voltage Vb1 becomes 0.80V. Moreover, when the response speed of the NMOS transistor N11 is the fastest, a highest value Vb2" of the bias voltage Vb2 is the highest, and when the response speed of the NMOS transistor N11 is the slowest, a highest value Vb2' of the bias voltage Vb2 is the lowest.

Meanwhile, the voltage level of the detection signal DET increases in proportion to the external voltage VDD until the NMOS transistor N12 is turned on. Further, when the NMOS transistor N12 is turned on, the voltage level of the detection signal DET decreases, and when the NMOS transistor N12 is turned on again, the voltage level of the detection signal DET abruptly rises. At this time, the voltage level of the detection signal DET varies variously depending upon variation in PVT. That is, the response speed of the NMOS transistor N12 to the bias voltage Vb2 and the resistance value of the resistor R13 vary depending upon variation in PVT. Furthermore, the response speed of the PMOS transistor P11 also varies depending upon the variation in PVT.

In FIG. 4, "TT" indicates a waveform of the detection signal DET when the response speeds of the NMOS transistor N12 and the PMOS transistor P11 are typical, and temperatures thereof are 25° C. "FF" indicates a waveform of the detection signal DET when the response speeds of the NMOS transistor N12 and the PMOS transistor P11 are the fastest, and temperatures thereof are 125° C. "SS" indicates a waveform of the detection signal DET when the response speeds of the NMOS transistor N12 and the PMOS transistor P11 are the slowest, and temperatures thereof are −10° C. "SF" indicates a waveform of the detection signal DET when the response speed of the NMOS transistor N12 is the slowest and the response speed of the PMOS transistor P11 is the fastest, and temperatures thereof are 125° C. "FS" indicates a waveform of the detection signal DET when the response speed of the NMOS transistor N12 is the fastest and the response speed of the PMOS transistor P11 is the slowest, and temperatures thereof are −10° C.

As can be seen from FIG. 4, when the response speeds of the NMOS transistors N11, N12 are the slowest (waveform "SS"), the highest value of the bias voltage Vb2 increases like Vb2" (e.g., 0.8V). Thus, the response speed of the NMOS transistor N12 can be compensated for so that it becomes fast. In contrast, when the response speeds of the NMOS transistors N11, N12 are the fastest (waveform "FF"), the highest value of the bias voltage Vb2 decreases like Vb2' (e.g., 0.63V). Thus, the response speed of the NMOS transistor N12 can be compensated for so that it becomes slow. Accordingly, skew between the detection signal DET (waveform "SS") when the highest value of the bias voltage Vb2 is Vb2" and the detection signal DET (waveform "FF") when the highest value of the bias voltage Vb2 is Vb2' can be reduced. As a result, since the bias voltage Vb2 increases or decreases according to variation in PVT so as to compensate for the response speed of the NMOS transistor N12, detection error of the power-up detection circuit 100 can be reduced. That is, since the level of a divided voltage to which the NMOS transistor N11 responds varies depending upon variation in PVT, the target detection voltage of the power-up detection circuit 100 can compensate for the detection error according to variation in PVT.

Figure 5:
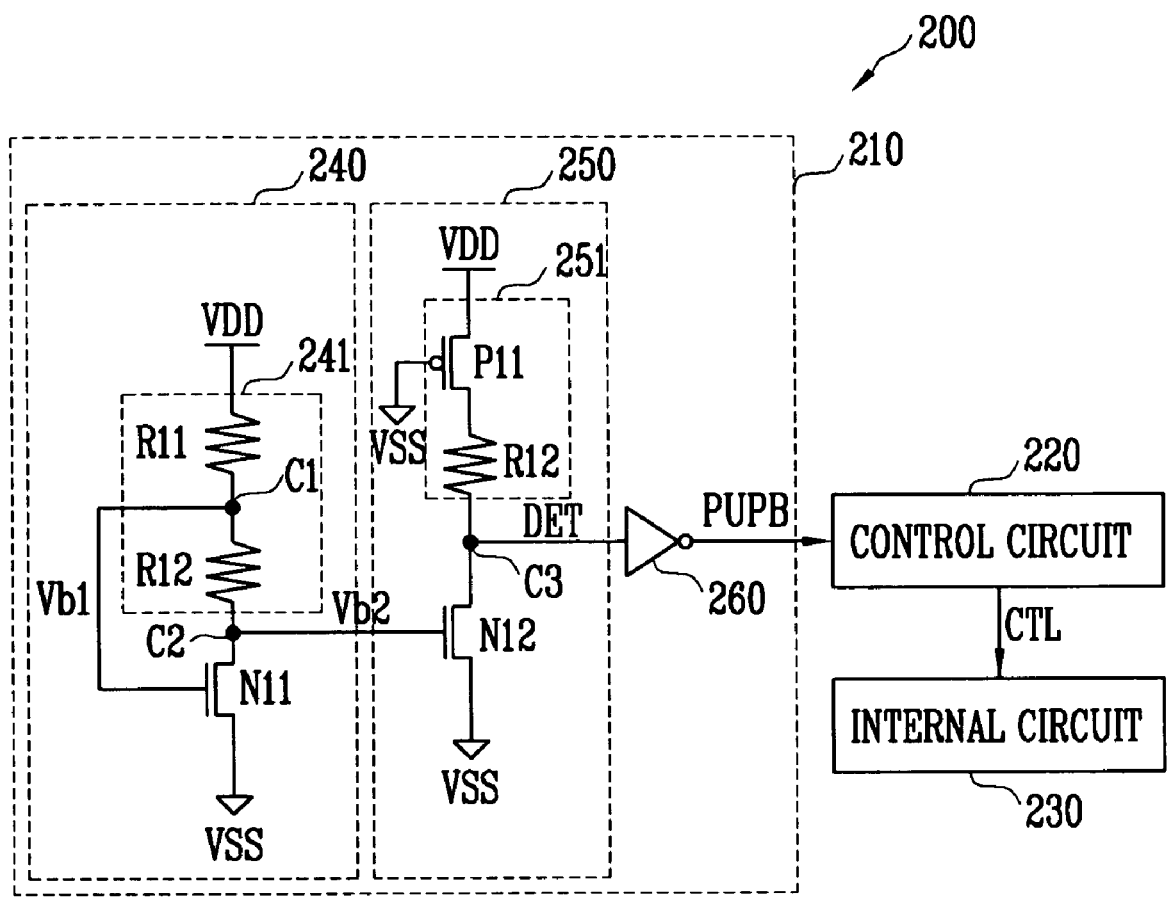
FIG. 5 is a circuit diagram of a semiconductor device according to an embodiment of the present invention.

FIG. 5 is a circuit diagram of a semiconductor device according to an embodiment of the present invention.

Referring to FIG. 5, the semiconductor device 200 includes a power-up detection circuit 210, a control circuit 220, and an internal circuit 230. At this time, the semiconductor device 200 can be, for example, a DDR DRAM, a DDR2 DRAM, a low power DRAM, etc. The power-up detection circuit 210 includes a bias circuit 240, a detection circuit 250, and an inverter 260. The construction and detailed operation of the power-up detection circuit 210 are substantially the same as those of the power-up detection circuit 100 that has been described with reference to FIG. 3. Thus, detailed description thereof will be omitted in order to avoid redundancy. The power-up detection circuit 210 monitors variation in an external voltage VDD, determines whether the external voltage VDD falls within a range of a target detection voltage, and generates a detection signal DET according to the determination result. More particularly, when the external voltage VDD falls within a range of a target detection voltage, the power-up detection circuit 210 disables the detection signal DET. When the external voltage VDD exceeds the target detection voltage, the power-up detection circuit 210 enables the detection signal DET. The control circuit 220 generates a mode control signal CTL in response to the detection signal DET. More particularly, when the detection signal DET is disabled, the control circuit 220 enables the mode control signal CTL, and when the detection signal DET is enabled, the control circuit 220 disables the mode control signal CTL. The internal circuit 230 switches to the operating mode when the mode control signal is enabled, and switches to a power-off mode when the mode control signal is disabled. Alternately, when the external voltage VDD falls within the range of the target detection voltage, the power-up detection circuit 210 can enable the detection signal DET. In this case, the control circuit 220 and the internal circuit 230 operate in the opposite manner as that described above.

As described above, according to the present invention, a bias voltage level of a pull-down circuit that outputs a detection signal is changed so that detection error depending upon variation in PVT is compensated for. Accordingly, there is an advantage in that the power-up detection circuit and semiconductor device including the same can operate in a stable way regardless of variation in PVT.

Although the foregoing description has been made with reference to the above-described embodiments, it is to be understood that changes and modifications of the present invention may be made by an ordinary person skilled in the art without departing from the spirit and scope of the present invention and appended claims.

What is claimed is:

1. A power-up detection circuit, comprising:
   a bias circuit that generates a bias voltage in response to an external voltage; and
   a detection circuit that generates a detection signal in response to the bias voltage, wherein
   the bias circuit increases the bias voltage until the external voltage reaches a predetermined voltage, and decreases the bias voltage when the external voltage is higher than the predetermined voltage;
   the response speed of the bias circuit to the external voltage and the response speed of the detection circuit to the bias voltage vary depending upon process, voltage and temperature (PVT); and
   the bias circuit comprises:
   a voltage divider which divides the external voltage according to a predetermined resistance ratio, and outputs the divided voltages; and
   an output circuit serially connected to a voltage divider through an output node, for outputting the bias voltage to the output node in response to the divided voltage.

2. The power-up detection circuit as claimed in claim 1, further comprising an output driver that drives and outputs the detection signal.

3. The power-up detection circuit as claimed in claim 1, wherein the output circuit is a MOS transistor.

4. The power-up detection circuit as claimed in claim 1, wherein the detection circuit decreases a voltage of the detection signal when the bias voltage becomes a first predetermined voltage, and increases the voltage of the detection signal when the bias voltage becomes a second predetermined voltage, wherein the first predetermined voltage is higher than the second predetermined voltage.

5. The power-up detection circuit as claimed in claim 1, wherein the detection circuit comprises:
   a pull-down circuit that outputs the detection signal to the output node in response to the bias voltage; and
   a pull-up circuit serially connected to the pull-down circuit through the output node, for supplying the external voltage to the pull-down circuit in response to a ground voltage.

6. The power-up detection circuit as claimed in claim 5, wherein the pull-up circuit and the pull-down circuit are MOS transistors.

7. The power-up detection circuit as claimed in claim 1, wherein the detection circuit comprises:
   a pull-down circuit that outputs the detection signal to the output node in response to the bias voltage; and
   a pull-up circuit serially connected to the pull-down circuit through the output node, for supplying the external voltage to the pull-down circuit in response to a ground voltage,
   wherein the level of the distributed voltage to which the output circuit responds varies depending upon the variation in PVT, and
   the level of the bias voltage to which the pull-down circuit responds varies depending upon the variation in PVT.

8. The power-up detection circuit as claimed in claim 7, wherein a highest value of the bias voltage, which is output from the output circuit when the distributed voltage to which the output circuit responds is a first voltage, is higher than a highest value of the bias voltage, which is output from the output circuit when the distributed voltage is a second voltage lower than the first voltage, and
   when the level of the distributed voltage to which the output circuit responds increases, the level of the bias voltage to which the pull-down circuit responds also increases.

9. A semiconductor device, comprising:
   a power-up detection circuit for monitoring variation in an external voltage, determining whether the external voltage falls within a range of a target detection voltage, and generating a detection signal according to the determination result;
   a control circuit that generates a mode control signal in response to the detection signal; and
   an internal circuit that switches to an operating mode for operation or to a power-off mode for stop, in response to the mode control signal,
   wherein the power-up detection circuit comprises a bias circuit that generates a bias voltage in response to the external voltage; and
   a detection circuit that generates the detection signal in response to the bias voltage, wherein the bias circuit increases the bias voltage until the external voltage reaches a predetermined voltage,
   wherein the bias circuit increases the bias voltage until the external voltage reaches a predetermined voltage, and decreases the bias voltage when the external voltage is higher than the predetermined voltage.

10. The semiconductor device as claimed in claim 9, further comprising an inverter for inverting the detection signal, and outputting the inverted signal as an additional detection signal,
    wherein the control circuit generates the mode control signal in response to the additional detection signal.

11. The semiconductor device as claimed in claim 9, wherein the response speed of the bias circuit to the external voltage and the response speed of the detection circuit to the bias voltage vary depending upon process, voltage and temperature (PVT).

12. The semiconductor device as claimed in claim 9, wherein the bias circuit comprises:
    a voltage divider which divides the external voltage according to a predetermined resistance ratio, and outputs the divided voltages; and
    an output circuit serially connected to a voltage divider through an output node, for outputting the bias voltage to the output node in response to the divided voltage.

13. The semiconductor device as claimed in claim 12, wherein the output circuit is a MOS transistor.

14. The semiconductor device as claimed in claim 9, wherein the detection circuit decreases a voltage of the detection signal when the bias voltage becomes a first predetermined voltage, and increases the voltage of the detection signal when the bias voltage becomes a second predetermined voltage, wherein the first predetermined voltage is higher than the second predetermined voltage.

15. The semiconductor device as claimed in claim 9, wherein the detection circuit comprises:
   a pull-down circuit that outputs the detection signal to the output node in response to the bias voltage; and
   a pull-up circuit serially connected to the pull-down circuit through the output node, for supplying the external voltage to the pull-down circuit in response to a ground voltage.

16. The semiconductor device as claimed in claim 15, wherein the pull-up circuit and the pull-down circuit are MOS transistors.

17. The semiconductor device as claimed in claim 12, wherein the detection circuit comprises:
   a pull-down circuit that outputs the detection signal to the output node in response to the bias voltage; and
   a pull-up circuit serially connected to the pull-down circuit through the output node, for supplying the external voltage to the pull-down circuit in response to a ground voltage,
   wherein the level of the distributed voltage to which the output circuit responds varies depending upon the variation in PVT, and
   the level of the bias voltage to which the pull-down circuit responds varies depending upon the variation in PVT.

18. The semiconductor device as claimed in claim 17, wherein a highest value of the bias voltage, which is output from the output circuit when the distributed voltage to which the output circuit responds is a first voltage, is higher than a highest value of the bias voltage, which is output from the output circuit when the distributed voltage is a second voltage lower than the first voltage, and
   when the level of the distributed voltage to which the output circuit responds increases, the level of the bias voltage to which the pull-down circuit responds also increases.

* * * * *